(12) United States Patent
Nii (10) Patent No.: US 6,624,667 B2
(45) Date of Patent: Sep. 23, 2003

(54) COMPARATOR AND ANALOG-TO-DIGITAL CONVERTER

(75) Inventor: Yasuo Nii, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/151,415

(22) Filed: May 20, 2002

(65) Prior Publication Data

US 2002/0175715 A1 Nov. 28, 2002

(30) Foreign Application Priority Data

May 25, 2001 (JP) ........................................ 2001-156542

(51) Int. Cl.[7] .............................................. H03K 5/153
(52) U.S. Cl. ................................ 327/77; 327/63; 327/65
(58) Field of Search .............................. 327/77, 63, 65, 327/69, 70, 72, 90, 91, 94, 407

(56) References Cited

U.S. PATENT DOCUMENTS 5,936,434 A * 8/1999 Kumamoto et al. .......... 327/77
6,150,850 A * 11/2000 Kinoshita ..................... 327/77

* cited by examiner

*Primary Examiner*—Tuan T. Lam
*Assistant Examiner*—Hiep Nguyen
(74) *Attorney, Agent, or Firm*—Katten Muchin Zavis Rosenman

(57) ABSTRACT

A comparator for an analog-to-digital converter having a tri-state inverter provided on the side where an input of a data register section is located, wherein the need for a switch on the input side in the data register section is eliminated to allow reduction of the number of components used in a comparator, and the flow-through current of the tri-state inverter can be reduced significantly by operating the tri-state inverter as a common inverter after making outputs from the comparator stable.

2 Claims, 8 Drawing Sheets

COMPARATOR AND ANALOG-TO-DIGITAL CONVERTER

BACKGROUND OF THE INVENTION

1. Field of the Invention

The present invention relates to a comparator for comparing a signal voltage with a reference voltage. More particularly, it relates to a comparator with a reduced number of circuit components and an analog-to-digital converter having the comparator.

2. Description of the Related Art

Figure 1:
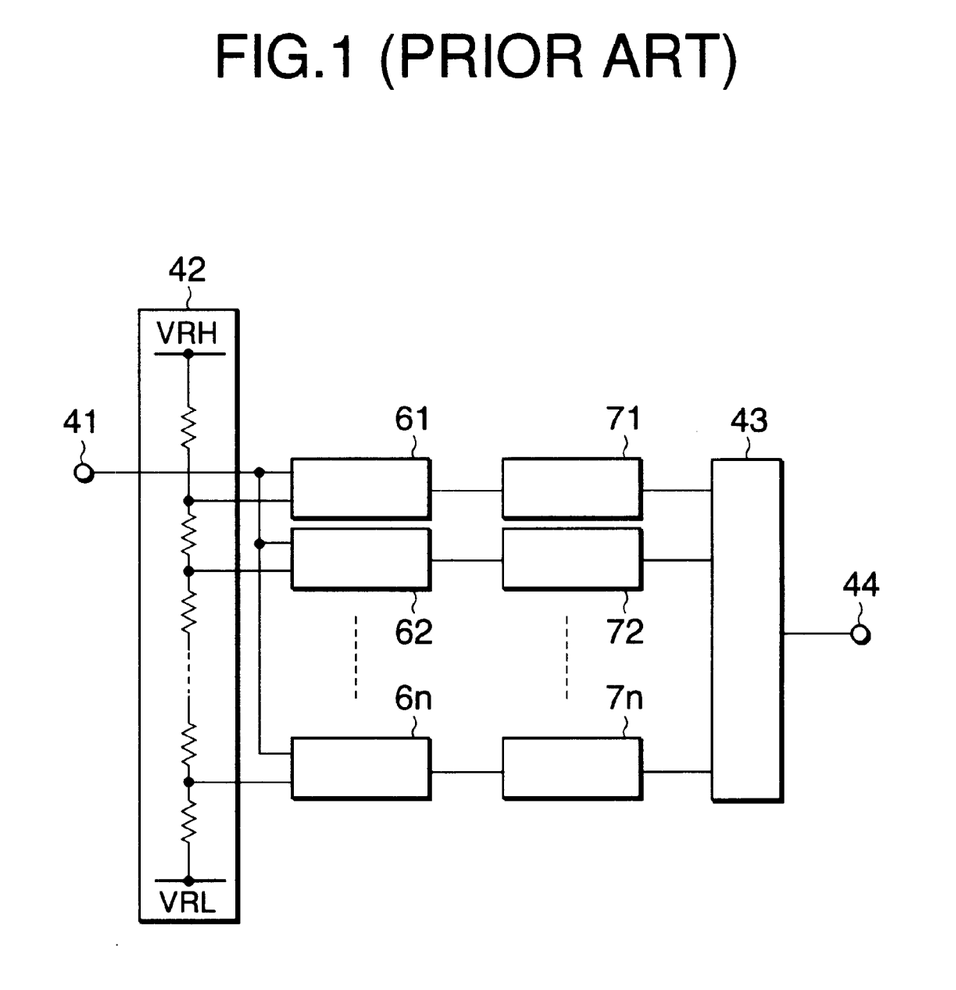
FIG. 1 is a circuit block diagram showing an example of a conventional analog-to-digital converter;.

As for a flash-type analog-to-digital converter for fast coding input analog signals to convert them into the digital form, the configuration shown in FIG. 1 is known as a conventional example. As shown in FIG. 1, a conventional analog-to-digital converter is configured: to compare input voltages from an analog signal input terminal 41 with the n levels of reference voltages, which is produced in a resistor ladder 42 by dividing a potential difference between the upper-potential reference voltage VRH and lower-potential reference voltage VRL, using comparators 61–6n; to store the results of the comparisons in data holding circuits 71–7n; and to convert the stored results into coded digital signals using an encoder 43 to output the signals from a digital signal output terminal 44.

Figure 2:
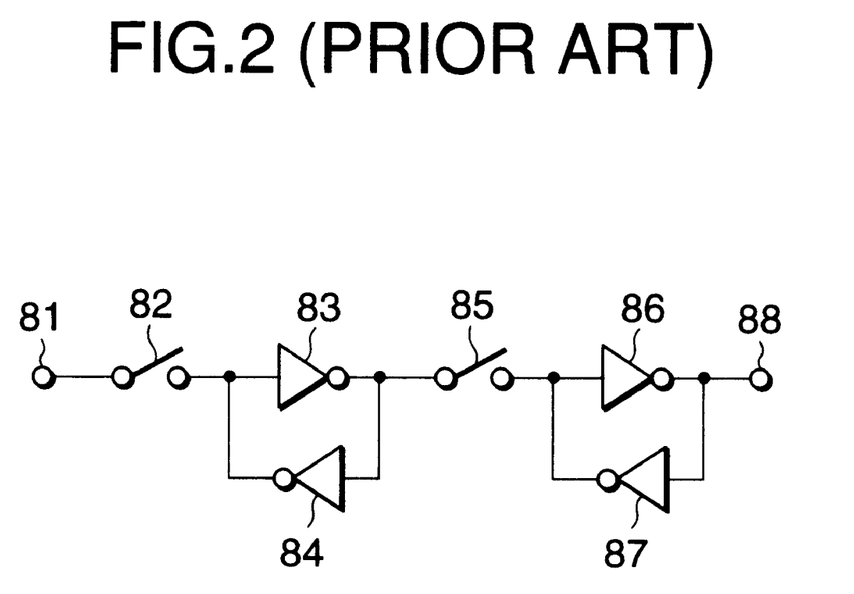
FIG. 2 is a circuit diagram showing a data holding circuit in an example of a conventional analog-to-digital converter.

In general, the comparators 61–6n are chopper type comparators, and the data holding circuits 71–7n are each arranged as shown in FIG. 2. An input data from a data input terminal 81 passes through a switch 82, which is closed when data is stored, and enters a master flip-flop composed of inverters 83, 84 connected so as to perform a positive feedback. An output of the master flip-flop passes through a switch 85, which is opened and closed in opposite phase to the switch 82, and enters a slave flip-flop composed of inverters 86, 87 connected so as to perform a positive feedback. Then, an output data from the slave flip-flop is output from a data output terminal 88.

In recent years, as a circuit scale has been enlarged for a multi-bit-capable analog-to-digital converter with high-accuracy, the reduction of the number of circuit components has been required to downsize the layout-scale thereof. Trying to constitute an 8-bit flash-type analog-to-digital converter, for example, in the case of FIG. 1 requires 255 comparators and the same number of, i.e. 255, data holding circuits because n=255. Therefore, the problem of the use of vast numbers of components as a whole arises when constituting an analog-to-digital converter by combining comparators and data holding circuits simply.

SUMMARY OF THE INVENTION

The invention was made in consideration of the foregoing problems, and intended to provide a comparator with a reduced number of circuit components and thereby to provide an analog-to-digital converter with a reduced number of circuit components.

A comparator in a basic configuration according to the invention includes: a selecting unit for selectively outputting a signal voltage and a reference voltage; a first capacitor having one end for receiving an output from the selecting unit; a first inverter having an input connected to the other end of the first capacitor; a first switch provided between the input and output of the first inverter; a tri-state inverter having an input connected to the output of the first inverter; a first latch unit having an input connected to the output of the tri-state inverter; and a second switch having one end provided between the output of the first latch unit and an input of a second latch unit.

Use of a comparator in the basic configuration according to the invention eliminates the need for a switch which is provided between the output of the comparator and a first latch unit traditionally in the related art, whereby the number of components in a data holding section (holding portion for storing an output voltage from a comparator) can be reduced.

In a comparator in the basic configuration according to the first embodiment of the invention, the first and second switches are closed and the output of the first tri-state inverter becomes a high impedance state when the selecting unit selects the signal voltage; and the first and second switches are opened and the first tri-state inverter operates as an inverter when the selecting unit selects the reference voltage.

In a comparator in the basic configuration according to the second embodiment of the invention, the first and second switches are closed and the output of the tri-state inverter becomes a high impedance state when the selecting unit selects the signal voltage; the first switch is opened when the selecting unit selects the reference voltage; and after the first switch becomes an opened state, the tri-state inverter is changed from the state where the output thereof has a high impedance to a state operable as an inverter and the second switch changes from the closed state to the opened state.

Use of a comparator according to the second embodiment of the invention, besides the advantage of a comparator in the basic configuration, allows reduction in flow-through current of the tri-state inverter in comparison to the first embodiment.

A comparator according to the third embodiment of the invention includes: a third switch provided between an output for a signal voltage and one end of a first capacitor; a first inverter having an input connected to the other end of the first capacitor; a first switch provided between the input and an output of the first inverter; a tri-state inverter having an input connected to the output of the first inverter; a first latch unit having an input connected to an output of the tri-state inverter; a second switch provided between an output of the first latch unit and an input of a second latch unit; a fourth switch provided between an output for a reference voltage and one end of a second capacitor; a fourth inverter having an input connected to the other end of the second capacitor; a fifth switch provided between the input and an output of the fourth inverter; a sixth switch provided between the one end of the first capacitor and the one end of the second capacitor; a seventh switch and a third capacitor connected in series between the input of the first inverter and the output of the fourth inverter; and an eighth switch and a fourth capacitor connected in series between the input of the fourth inverter and the output of the first inverter, wherein the signal voltage and reference voltage are simultaneously output to the one end of the first capacitor and to the one end of the second capacitor respectively while the seventh and eighth switches are turned on, and further the first switch is turned on to hold a difference voltage between the signal voltage and an offset voltage of the first inverter on both ends of the first capacitor, and the fifth switch is turned on to hold a difference voltage between the reference voltage and an offset voltage of the fourth inverter on both ends of the second capacitor, after the signal voltage and reference voltage are simultaneously output to the one end of the first capacitor and to the one end of the second capacitor respectively, the third, fourth, seventh, eighth switches are turned off while the sixth switch is turned on and the first and fifth switches are turned off to amplify approximately one half voltage of a difference voltage between the signal voltage and reference voltage using the first inverter, and after the first and fifth switches are turned off, the seventh and eighth switches are turned on while the tri-state inverter operates as an inverter to output an output voltage of the first inverter on the output of the tri-state inverter.

Use of a comparator according to the third embodiment of the invention, besides the advantage of a comparator in the basic configuration, makes it possible to provide a comparator with less current consumption in comparison to the first embodiment, lower noise in comparison to the second embodiment, and poor sensitivity to the in-phase noise.

According to the fourth embodiment of the invention, an analog-to-digital converter includes: a plurality of comparators in the basic configuration for receiving an identical signal voltage; a dividing unit for supplying a reference voltage to each of the comparators; and an encoder for receiving outputs from the respective comparators to output a coded digital signal.

Use of a comparator according to the fourth embodiment of the invention eliminates the need for a switch which is provided between the output of the comparator and a first latch unit traditionally in the related art, whereby the number of components in a data holding section that constitutes an analog-to-digital converter can be reduced.

BRIEF DESCRIPTION OF THE DRAWINGS

The invention disclosed herein will be understood better with reference to the accompanying drawings, in which.

DETAILED DESCRIPTION OF THE PREFERRED EMBODIMENTS

Figure 3:
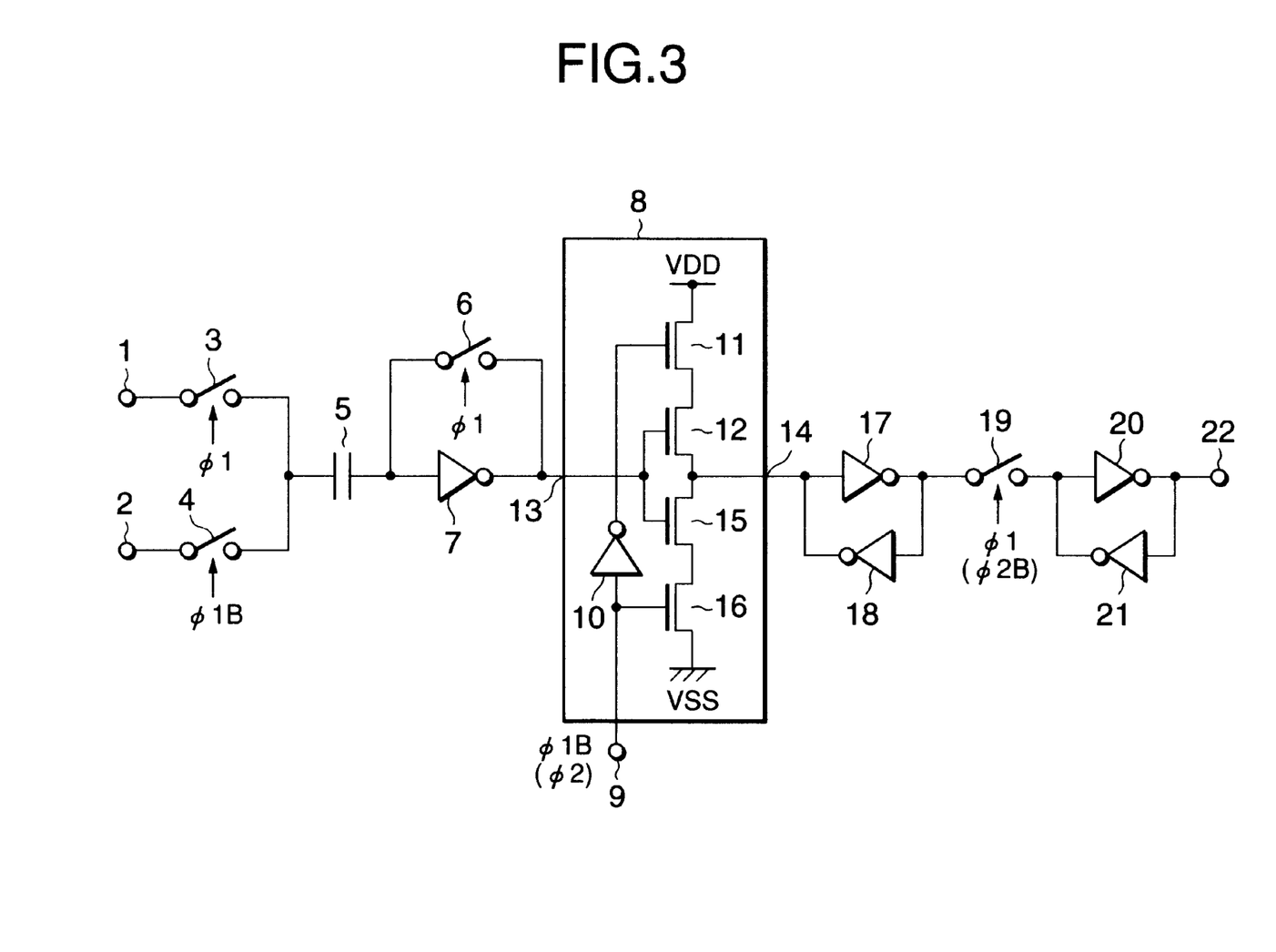
FIG. 3 is a circuit diagram showing a comparator according to the first and second embodiments of the invention.

Referring now to the drawings, FIG. 3 is a circuit diagram showing a comparator of the first embodiment of the invention. As shown in FIG. 3, a comparator of the first embodiment of the invention includes a signal voltage input terminal 1, a reference voltage input terminal 2, switches 3 and 4, a capacitor 5, a switch 6 and an inverter 7, a tri-state inverter 8, a control input terminal 9, inverters 17 and 18, a switch 19, inverters 20 and 21, and an output terminal 22.

An analog signal voltage is applied to the switch 3 through the signal voltage input terminal 1, and a reference voltage for comparison is applied to the switch 4 through the reference voltage input terminal 2. The switches 3, 4 used as compared signal output switches output either the analog signal voltage or reference voltage selectively.

The selected output from the switch 3 or 4 is received by the capacitor 5 at one end thereof. The other end of the capacitor 5 is connected to the input of the inverter 7.

The switch 6 is connected between the output and input of the inverter 7.

The output of the inverter 7 is connected to the input 13 of the tri-state inverter 8.

The output 14 of the tri-state inverter 8 is connected to the input of the inverter 17.

The input of the inverter 18 is connected to the output of the inverter 17, and the output of the inverter 18 is connected to the input of the inverter 17.

The output of the inverter 17 is connected to one end of the switch 19, and the other end of the switch 19 is connected to the input of the inverter 20.

The input and output of the inverter 21 are connected to the output and input of the inverter 20 respectively, and the output of the inverter 20 is connected to the output terminal 22.

The opening and closing operations of the switches 3, 6, and 19 are controlled by control signals $\phi 1$, and those switches are individually closed with a control signal $\phi 1$ of logic H level and opened with a control signal $\phi 1$ of logic L level.

The opening and closing operations of the switch 4 are controlled by control signals $\phi 1B$ which are inverted signals of the control signals $\phi 1$, and the switch 4 is closed with a control signal $\phi 1B$ of logic H level and opened with a control signal $\phi 1B$ of logic L level.

The tri-state inverter 8 comprises an inverter 10, P-channel MOS transistors 11, 12, and N-channel MOS transistors 15, 16.

The upper-potential source voltage VDD is applied to the source of the P-channel MOS transistor 11 having the drain connected to the source of the P-channel MOS transistor 12. The lower-potential source voltage VSS is applied to the source of the N-channel MOS transistor 16 having the drain connected to the source of the N-channel MOS transistor 15. The gates of the P-channel MOS transistor 12 and N-channel MOS transistor 15 are connected with each other to form the input 13, and the drains of the P-channel MOS transistor 12 and N-channel MOS transistor 15 are connected with each other to form the output 14.

The inverter 10 has the input connected to the gate of the N-channel MOS transistor 16, and the output connected to the gate of the P-channel MOS transistor 11. The control signals $\phi 1B$ are applied to the input of the inverter 10 through the control input terminal 9.

The tri-state inverter 8 operates as a common inverter with a control signal $\phi 1B$ of logic H level, and its output 14 becomes a high impedance state with a control signal $\phi 1B$ of logic L level.

Figure 4:
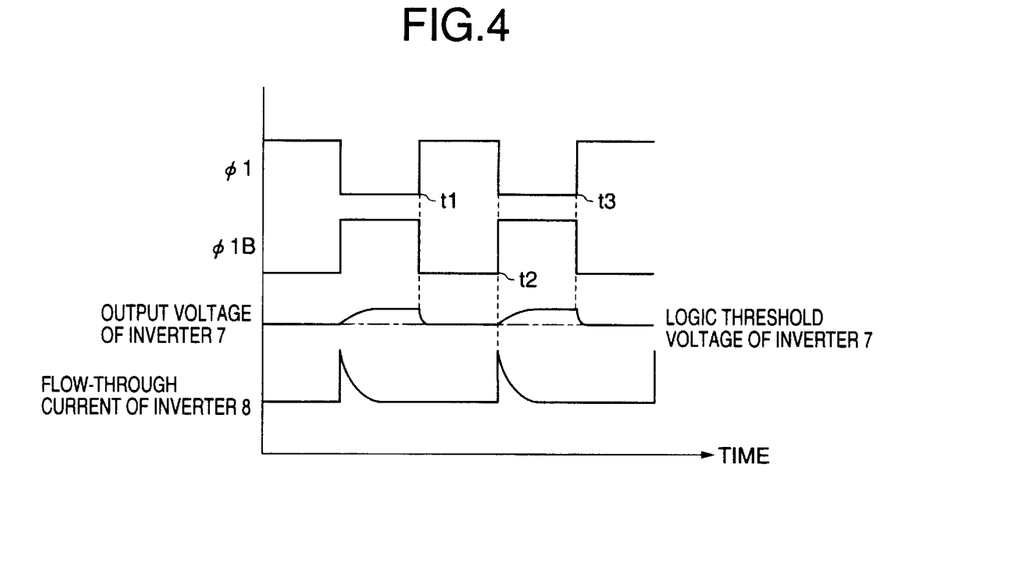
FIG. 4 is a timing chart showing the operation of a comparator according to the first embodiment of the invention.

Now, the operation of the comparator is described. FIG. 4 is a timing chart showing the operation of a comparator according to the first embodiment of the invention. First, during the sampling period from the time t1 to t2, the control signals $\phi 1$ and $\phi 1B$ are at the logic H level and logic L level respectively, whereby the switches 3 and 6 are closed and the switch 4 is opened. As a result, an analog signal voltage from the signal voltage input terminal 1 is input to the capacitor 5 through the switch 3.

During this period, the input and output of the inverter 7 are connected by the switch 6 and maintained at the logic threshold voltage of the inverter 7, so that the capacitor 5 stores the charge corresponding to the difference voltage between the analog signal voltage and the logic threshold voltage of the inverter 7.

In addition, the output 14 of the tri-state inverter 8 becomes a high impedance state and the switch 19 is closed, so that data in a previous period held by a previous stage flip-flop composed of the inverters 17, 18 connected so as to perform a positive feedback as latch means is held by a subsequent stage flip-flop to be outputted, the subsequent stage flip-flop being composed of the inverters 20, 21 connected so as to perform a positive feedback as the subsequent stage latch means.

Also, during the period, the P-channel MOS transistor 11 and N-channel MOS transistor 16 are non-conductive, whereby no flow-through current is produced in the tri-state inverter 8.

Second, during the amplification period from the time t2 to t3, the control signals $\phi 1$ and $\phi 1B$ are at the logic L and logic H levels respectively, whereby the switches 3 and 6 are opened and the switch 4 is closed. As a result, a reference voltage from the reference voltage input terminal 2 is input to the capacitor 5 through the switch 4.

At that time, the difference voltage between the analog signal voltage and the reference voltage becomes the amount of change in potential of an electrode on the side of the capacitor 5 where the switch 4 is located, and the amount of change is transmitted to another electrode on the side of the capacitor 5 where the inverter 7 is located. As a result, the amount of change in potential is amplified and output by the inverter 7.

The tri-state inverter 8 operates as a normal inverter, and amplifies an output voltage of the inverter 7 to output the resultant voltage. The output voltage of the tri-state inverter 8 is held by the flip-flop composed of the inverters 17, 18.

During this period, the switch 19 remains open, so that the latched data in the flip-flop composed of the inverters 17, 18 is not held by the subsequent stage flip-flop composed of the inverters 20, 21 and the flip-flop composed of the inverters 20, 21 outputs data held in the previous period.

Also, during this period, the P-channel MOS transistor 11 and N-channel MOS transistor 16 are conductive, and logic threshold voltages of the inverter 7 and tri-state inverter 8 are equivalent, so that flow-through current is produced in the tri-state inverter 8 when the output voltage of the inverter 7 or the input voltage of the tri-state inverter 8 is in the vicinity of the logic threshold voltage.

As described above, according to a comparator configuration of the first embodiment of the invention, integrating a chopper type comparator section with a data holding section reduces the number of circuit components. Therefore, when the comparator 61–6n and data holding circuit 71–7n in the example of a conventional flash-type analog-to-digital converter shown in FIG. 1 are replaced with comparators according to the first embodiment of the invention, each individual switch corresponding to the switch 82 shown in FIG. 2 becomes unnecessary in respective data holding circuits 71–7n. As a result, for example, because n=255 in the case of 8 bits, it is possible to reduce the number of the switch elements by 255, and further when the switch element has the CMOS structure, it become possible to effect reduction of 510 transistors in an entire analog-to-digital converter.

Now, a comparator according to the second embodiment of the invention is described. The configuration of a comparator of the second embodiment is different from a comparator of the first embodiment of the invention in that the control signals $\phi 1B$ to be input to the control input terminal 9 are changed to control signals $\phi 2$, and the control signals $\phi 1$ for controlling the opening and closing operations of the switch 19 are changed to control signals $\phi 2B$ which are inverted signals of the control signals $\phi 2$. The components other than the above-described components are the same as those of the first embodiment and therefore are identified by the same reference character to omit detailed descriptions for the same components.

The tri-state inverter 8 operates as a normal inverter when a control signal $\phi 2$ is at logic H level, and its output 14 becomes a high impedance state when a control signal $\phi 2$ is at logic L level.

The opening and closing operations of the switch 19 are controlled by control signals $\phi 2B$, and the switch is closed when a control signal $\phi 2B$ is at logic H level and opened when a control signal $\phi 2B$ is at logic L level.

Figure 5:
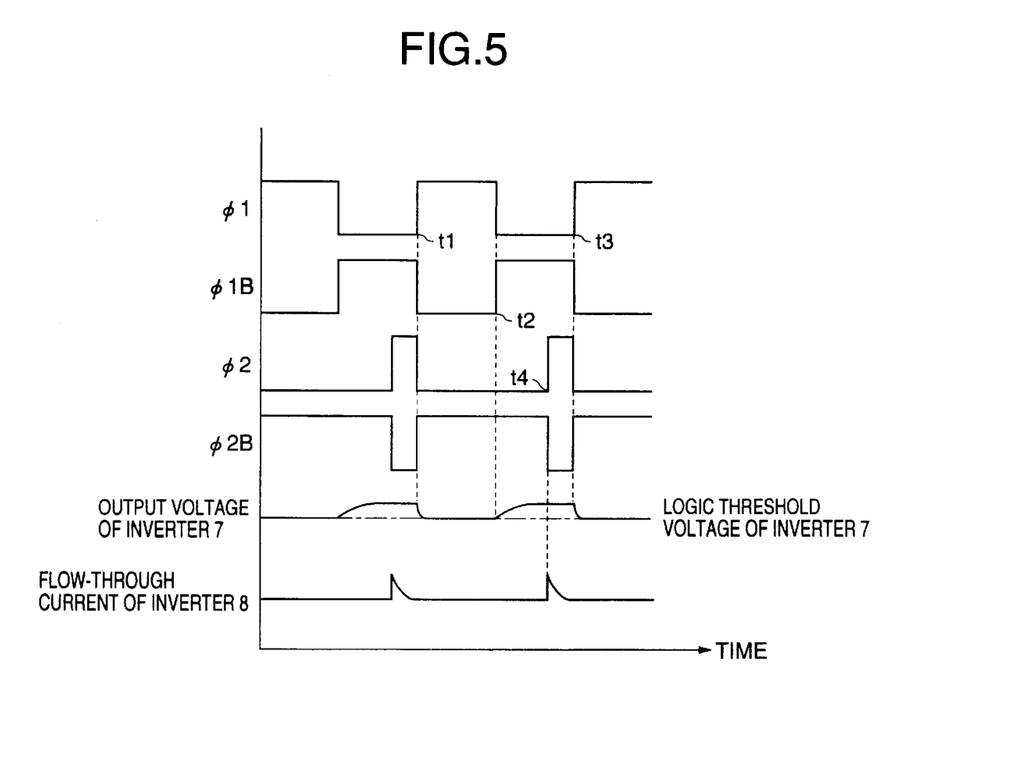
FIG. 5 is a timing chart showing the operation of a comparator according to the second embodiment of the invention.

Now, the operation of the comparator is described. FIG. 5 is a timing chart showing the operation of the comparator according to the second embodiment of the invention. First, during the sampling period from the time t1 to t2, the control signals $\phi 2$ and $\phi 2B$ are at the logic L and logic H levels respectively, and the operation of the comparator is exactly the same as that of the first embodiment of the invention.

Second, within the amplification period from the time t2 to t3, a time t4 is set after the time t2 so that a minimum time for which the tri-state inverter 8 can perform the amplification operation sufficiently remains before t3 and for the period from the time t4 to t3 the control signal $\phi 2$ is at the logic H level and the control signal $\phi 2B$ is at the logic L level. As a result, the tri-state inverter 8 operates as a normal inverter only for the period from the time t4 to t3 while the tri-state inverter 8 amplifies an output voltage of the inverter 7 and outputs it, and the output voltage of the tri-state inverter 8 is held by the flip-flop composed of the inverters 17, 18. During this period the switch 19 remains open, so that the data held in the flip-flop composed of the inverters 17, 18 is not held in the subsequent flip-flop composed of the inverters 20, 21 and the flip-flop composed of the inverters 20, 21 outputs the data held in the previous period.

For the period from the time t4 to t3 the P-channel MOS transistor 11 and N-channel MOS transistor 16 are conductive, so that when the output voltage of the inverter 7 or the input voltage of the tri-state inverter 8 is in the vicinity of the logic threshold voltage, flow-through current is produced in the tri-state inverter 8. However, the inverter 7, which supplies an input voltage of the tri-state inverter 8, has started the amplification operation at the time t2 before the time t4 and the output voltage of the inverter 7 has already become stable well away from the vicinity of the logic threshold voltage at the time t4, so that flow-through current in the tri-state inverter 8 for the period from the time t4 to t3 is in a little amount in comparison to that of the comparator according to the first embodiment of the invention.

In addition, during the period from the time t2 to t4, the control signal $\phi 2$ is at the logic L level and the control signal $\phi 2B$ is at the logic H level, so that the tri-state inverter 8 is in a high impedance state and the flow-through current thereof entirely becomes zero.

As described above, according to a comparator configuration of the second embodiment of the invention, the tri-state inverter 8 and switch 19 are controlled during a part of the amplification period from the time t2 to t3. Therefore, in addition to the reduced number of circuit components compared with the case of a comparator according to the first embodiment of the invention, the flow-through current of the tri-state inverter 8 during the amplification period can be reduced, thereby providing a comparator with reduced current consumption and lower noise.

As a specific example, in the case where the inverter 7 and tri-state inverter 8 are able to flow current equivalent to each other and the period from the time t2 to t4 is approximately equal to a quarter of one cycle, it is possible to reduce 10% to 20% of the current consumption in a single comparator or an entire analog-to-digital converter.

Figure 6:
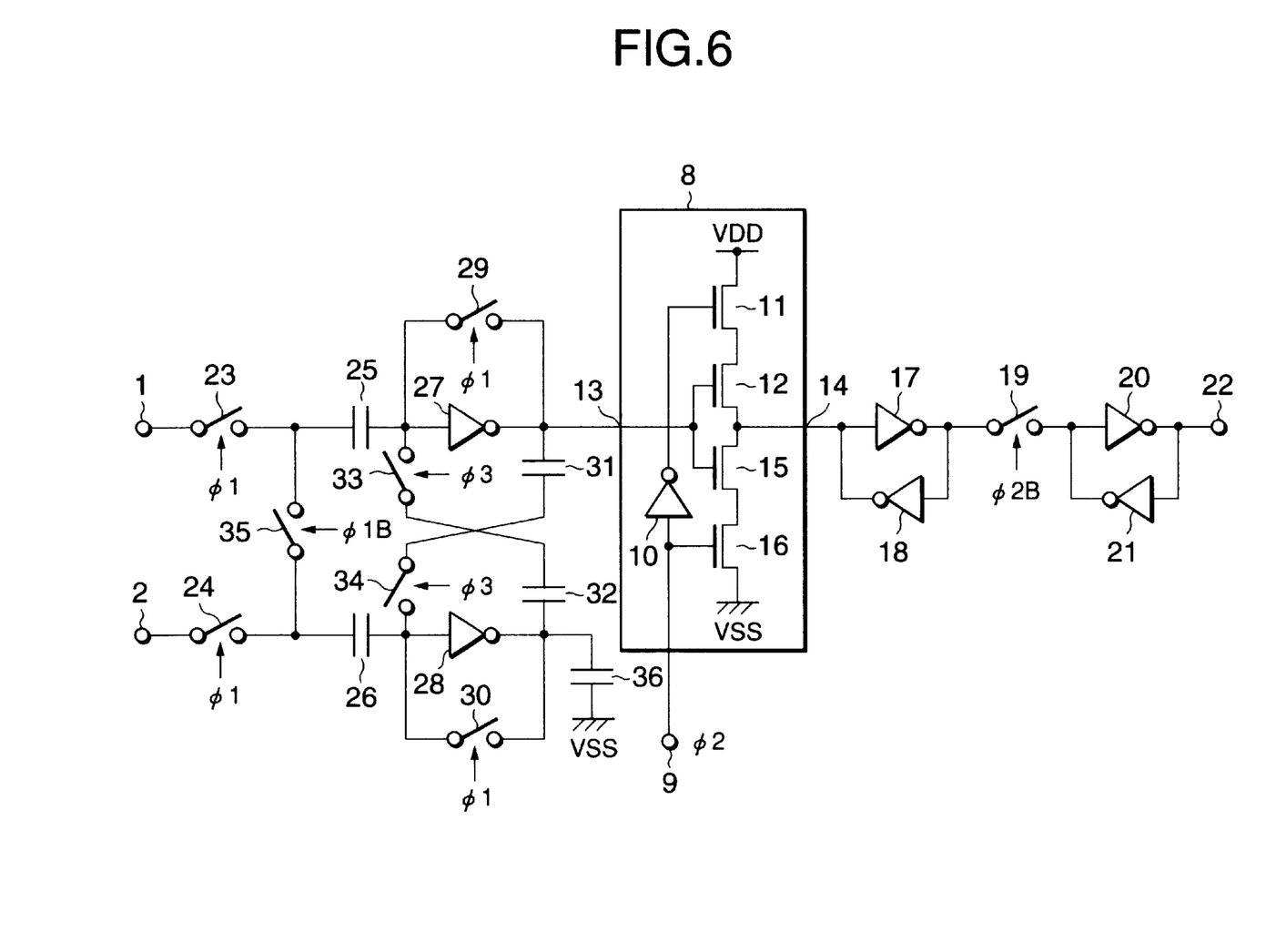
FIG. 6 is a circuit diagram showing a comparator according to the third embodiment of the invention.

Referring now to FIG. 6, which is a circuit diagram showing a comparator according to the third embodiment of the invention, the configuration of a comparator of the third embodiment is different from a comparator of the second embodiment of the invention in that the input portion of the comparator is changed to a balanced type one. However, the components other than the above-described component are the same as those of the second embodiment and therefore, are identified by the same reference character to omit detailed descriptions for the same components.

As shown in FIG. 6, a comparator of the third embodiment of the invention includes: a signal voltage input terminal 1; a reference voltage input terminal 2; switches 23, 24; capacitors 25, 26; inverters 27, 28; switches 29, 30; capacitors 31, 32; switches 33, 34, 35; a capacitor 36; a tri-state inverter 8; a control input terminal 9; inverters 17, 18; a switch 19; inverters 20, 21; and an output terminal 22.

An analog signal voltage is supplied to one end of the switch 23 through the signal voltage input terminal 1. The other end of the switch 23 is connected to one end of the capacitor 25 and the other end of the capacitor 25 is connected to the input of the inverter 27.

The switch 29 is connected between the output and input of the inverter 27 and the input 13 of tri-state inverter 8 is connected to the output of the inverter 27.

A reference voltage for comparison is supplied to one end of the switch 24 through the reference voltage input terminal 2. The other end of the switch 24 is connected to the one end of the capacitor 26, and the other end of the capacitor 26 is connected to the input of the inverter 28.

The switch 30 is connected between the output and input of the inverter 28, and the output of the inverter 28 is also connected to one end of the capacitor 36 that has the other end thereof supplied with a lower-potential source voltage VSS.

The capacitor 36 is a dummy capacitor for matching the load conditions of the inverters 27, 28, and the capacitance value of the capacitor 36 is set so that it become equal to the capacitance value of the input 13 of the tri-state inverter 8.

One end of the capacitor 31 is connected to the output of the inverter 27 and the switch 34 is connected between the other end of the capacitor 31 and the input of the inverter 28.

One end of the capacitor 32 is connected to the output of the inverter 28 and the switch 33 is connected between the other end of the capacitor 32 and the input of the inverter 27.

The switch 35 is connected between one end of the capacitor 25 on the side where the switch 23 is located and one end of the capacitor 26 on the side where the switch 24 is located.

The opening and closing operations of the switches 23, 24, 29, and 30 are controlled by control signals φ1, and those switches are individually closed when a control signal φ1 is at logic H level and opened when a control signal φ1 is at logic L level.

The opening and closing operations of the switch 35 are controlled by control signals φ1B which are inverted signals of the control signals φ1, and the switch is closed when a control signal φ1B is at logic H level and opened when a control signal φ1B is at logic L level.

The tri-state inverter 8 operates as a normal inverter when a control signal φ2 is at logic H level, and its output 14 becomes a high impedance state when a control signal φ2 is at logic L level.

The opening and closing operations of the switch 19 are controlled by control signals φ2B, and the switch is closed when a control signal φ2B is at logic H level and opened when a control signal φ2B is at logic L level.

The opening and closing operations of the switches 33, 34 are controlled by control signals φ3, and those switches are individually closed when control signals φ3 are at logic H level and opened when control signals φ3 are at logic L level.

Figure 7:
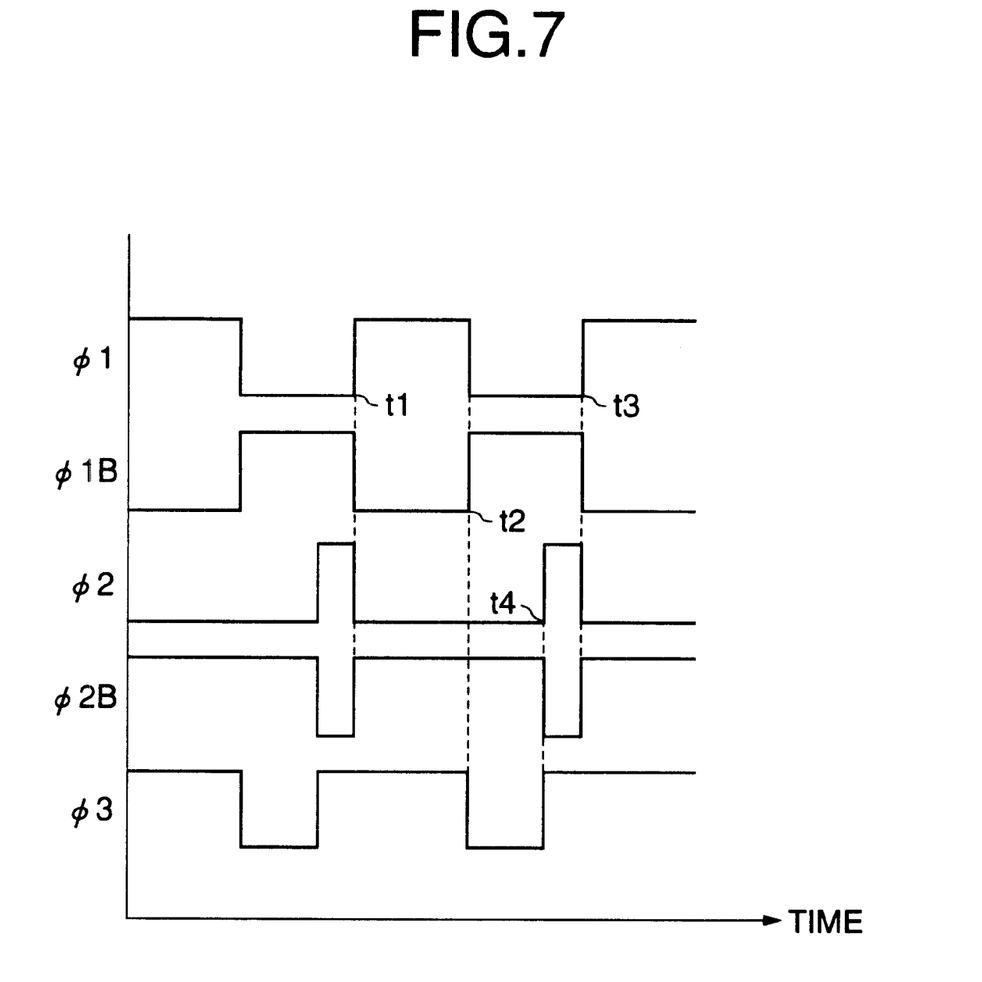
FIG. 7 is a timing chart showing the operation of a comparator according to the third embodiment of the invention.

Now, the operation of the comparator is described. FIG. 7 is a timing chart showing the operation of a comparator according to the third embodiment of the invention. First, during the sampling period from the time t1 to t2, the control signals φ1, φ1B, φ2, φ2B, and φ3 are at the logic H, logic L, logic L, logic H, and logic H levels respectively, whereby the switches 23, 24, 29, and 30 are closed and the switch 35 is opened. As a result, an analog signal voltage from the signal voltage input terminal 1 is input to the capacitor 25 through the switch 23 while a reference voltage from the reference voltage input terminal 2 is input to the capacitor 26 through the switch 24.

During this period, the input and output of the inverter 27 are connected by the switch 29 and maintained at the logic threshold voltage of the inverter 27, so that the capacitor 25 stores the charge corresponding to the difference voltage between the analog signal voltage and the logic threshold voltage of the inverter 27. Also, during this period, the input and output of the inverter 28 are connected by the switch 30 and maintained at the logic threshold voltage of the inverter 28, so that the capacitor 26 stores the charge corresponding to the difference voltage between the reference voltage and the logic threshold voltage of the inverter 28.

In addition, the switch 33, 34 are closed for offset-cancellation, so that the capacitor 31, 32 are charged with the difference voltage between the logic threshold voltages of the inverters 27 and 28 caused by variations between the transistors.

Second, during the amplification period from the time t2 to t3, the control signals φ1 and φ1B are at the logic L and logic H levels respectively, whereby the switches 23, 24, 29 and 30 are opened and the switch 35 is closed. As a result, the charges stored in the capacitor 25, 26 are redistributed, whereby the halves of the difference voltage between the analog signal voltage and the reference voltage are each supplied to the inputs of the inverters 27, 28 and amplified.

Furthermore, during the period from the time t2 to t4, the control signal φ3 is at the logic L level, so that the capacitors 31, 32 are separated for a time. Then, since the time t4 the control signal φ3 is at the logic H level, whereby the inverters 27, 28 carry out latch operations while performing the offset-cancellation and output voltages from the inverters 27, 28 are amplified by large amounts.

In addition, during the period from the time t4 to t3, the tri-state inverter 8 performs amplification.

Note that the tri-state inverter 8, inverters 17, 18, switch 19, and inverters 20, 21 operate in the same way as in a comparator according to the second embodiment of the invention.

As described above, according to a comparator configuration of the third embodiment of the invention, a balanced type comparator allows the number of circuit components to be reduced as observed in the case of a comparator according to the second embodiment of the invention, and makes it possible to reduce the flow-through current of the tri-state inverter 8 during the amplification period, providing a comparator with reduced current consumption and lower noise, and enhanced insensitivity to the in-phase noise.

Figure 8:
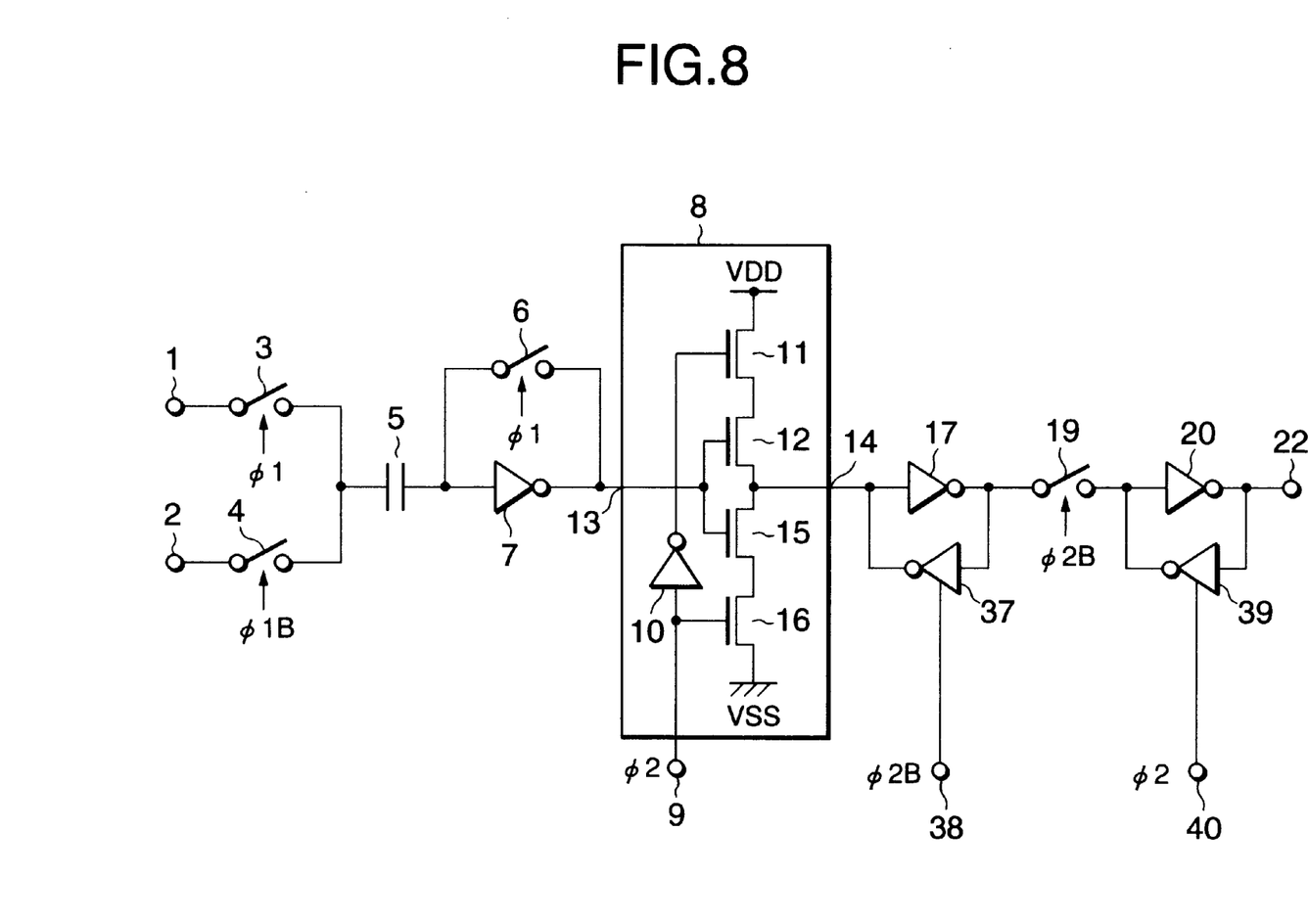
FIG. 8 is a circuit diagram showing a comparator according to the fourth embodiment of the invention.

Referring now to FIG. 8, which is a circuit diagram showing a comparator according to the fourth embodiment of the invention, the configuration of a comparator of the fourth embodiment is different from a comparator of the second embodiment of the invention in that the inverter 18 is changed to a tri-state inverter 37 and the inverter 21 is changed to a tri-state inverter 39. However, the components other than the above-described components are the same as those of the second embodiment and therefore, are identified by the same reference character to omit detailed descriptions for the same components.

The tri-state inverter 8 operates as a normal inverter when a control signal φ2 is at logic H level, and its output 14 becomes a high impedance state when a control signal φ2 is at logic L level.

The opening and closing operations of the switch 19 are controlled by control signals φ2B, and the switch is closed when a control signal φ2B is at logic H level and opened when a control signal φ2B is at logic L level.

The tri-state inverter 37 operates as a normal inverter when a control signal φ2B indicative of the logic H level is supplied to a control input terminal 38 and its output becomes a high impedance state when a control signal φ2B indicative of the logic L level is supplied to the terminal.

The tri-state inverter 39 operates as a normal inverter when a control signal φ2 indicative of logic H level is supplied to a control input terminal 40, and its output becomes a high impedance state with a control signal φ2 indicative of logic L level.

Now, the operation of the comparator is described. When control signals φ2 and φ2B become logic L and logic H levels respectively, the output 14 of the tri-state inverter 8 becomes a high impedance state and the switch 19 is closed, so that data held by the flip-flop composed of the inverter 17 and tri-state inverter 37 connected so as to perform a positive feedback as latch means is output to the subsequent stage inverter 20.

Also, when control signals φ2 and φ2B become logic H and logic L levels respectively, the tri-state inverter 8 operates as a normal inverter and an output voltage of the tri-state inverter 8 is supplied to the inverter 17. However, at that time the switch 19 is opened, so that the flip-flop composed of the inverter 20 and tri-state inverter 39 connected so as to perform a positive feedback as latch means latches data and outputs it.

Therefore, even when output voltages of the tri-state inverters 8, 37 are different from each other in writing data on the respective flip-flops, flow-through currents of the tri-state inverters 8, 37 can be prevented. Likewise, even when output voltages of the inverter 17 and tri-state inverter 39 are different from each other, flow-through currents of the inverter 17 and tri-state inverter 39 can be also prevented.

As described above, according to a comparator configuration of the fourth embodiment of the invention, the number of circuit components can be reduced as observed in the case of a comparator according to the second embodiment of the invention and the flow-through current can be further reduced in comparison to a comparator according to the second embodiment of the invention, thereby providing a comparator with significantly reduced current consumption and lower noise.

Figure 9:
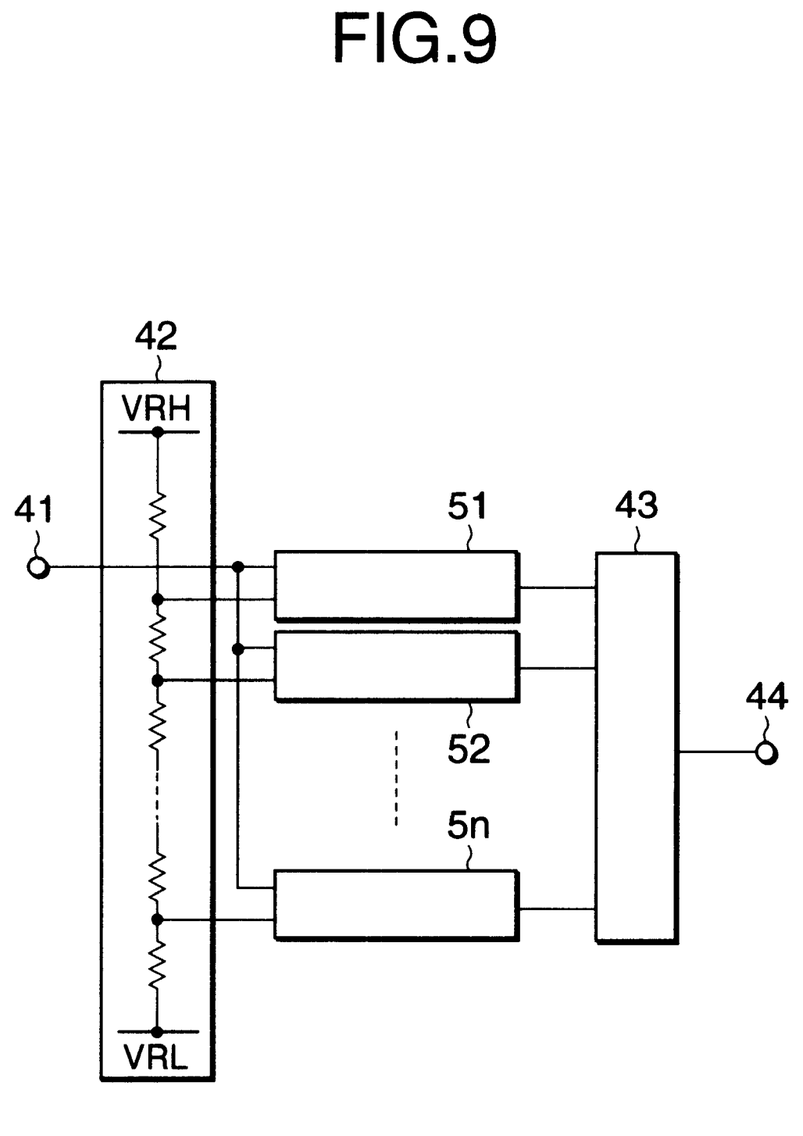
FIG. 9 is a circuit block diagram showing an analog-to-digital converter according to the fifth embodiment of the invention.

Now, FIG. 9 is a circuit block diagram showing an analog-to-digital converter according to the fifth embodiment of the invention. As shown in FIG. 9, an analog-to-digital converter of the fifth embodiment of the invention includes: an analog signal input terminal 41; a resistor ladder 42; an encoder 43; a digital signal output terminal 44; and comparators 51–5n (n is a natural number)

For each individual comparator 51–5n, a comparator according to the first embodiment of the invention shown in FIG. 3 is used.

The comparators 51–5n each include a signal voltage input terminal 1, and identical analog signal voltages are input to the respective signal voltage input terminals 1 through an analog signal input terminal 41.

A resistor ladder 42 used as dividing means divides a potential difference between the upper-potential reference voltage VRH and lower-potential reference voltage VRL using a group of resistors connected in series to produce n levels of reference voltages different from each other and to supply the resultant reference voltages to their corresponding reference voltage input terminals 2 of the comparators 51–5n respectively.

The encoder 43 that receives outputs of comparison results from the respective comparators 51–5n performs coding into codes corresponding to the comparison results, and outputs the resultant coded digital signal to the digital signal output terminal 44.

As described above, according to an analog-to-digital converter configuration of the fifth embodiment of the invention, a comparator according to the first embodiment of the invention is used for each individual comparator 51–5n, reducing the number of circuit components in an entire analog-to-digital converter.

Although comparators according to the first embodiment of the invention are used for respective comparators 51–5n in an analog-to-digital converter according to the fifth embodiment of the invention, alternatively any one of comparators according to the second, third, and fourth embodiments of the invention may be used. The effect resulting from use of a comparator according to the first embodiment is equivalent to the effects produced by comparators according to the second, third, and fourth embodiments.

The invention is able to provide a comparator with a reduced number of circuit components and enhanced insensitivity to the in-phase noise, and in addition, reduce flow-through current in a comparator, permitting the current consumption and noise to be lowered, and further, realize an analog-to-digital converter as an application of such comparator.

What is claimed is:

1. A comparator comprising:
   a first switch provided between an output for a signal voltage and one end of a first capacitor;
   a first inverter having an input connected to the other end of said first capacitor;
   a second switch provided between the input and an output of said first inverter;
   a tri-state inverter having an input connected to the output of said first inverter;

a first latch unit having an input connected to an output of said tri-state inverter;

a third switch having one end provided between an output of said first latch unit and an input of a second latch unit;

a fourth switch provided between an output for a reference voltage and one end of a second capacitor;

a fourth inverter having an input connected to the other end of said second capacitor;

a fifth switch provided between the input and an output of said fourth inverter;

a sixth switch provided between said one end of said first capacitor and said one end of said second capacitor;

a seventh switch and a third capacitor connected in series between the input of said first inverter and the output of said fourth inverter; and an eighth switch and a fourth capacitor connected in series between the input of said fourth inverter and the output of said first inverter, wherein:

the signal voltage and reference voltage are simultaneously output to said one end of said first capacitor and to said one end of said second capacitor respectively while said seventh and eighth switches are turned on, and further said first switch is turned on to hold a difference voltage between the signal voltage and an offset voltage of said first inverter on both ends of said first capacitor, and said fifth switch is turned on to hold a difference voltage between the reference voltage and an offset voltage of said fourth inverter on both ends of said second capacitor, after the signal voltage and reference voltage are simultaneously output to said one end of said first capacitor and to said one end of said second capacitor respectively, said third, fourth, seventh, eighth switches are turned off while said sixth switch is turned on and said first and fifth switches are turned off to amplify approximately one half voltage of a difference voltage between the signal voltage and reference voltage using said first inverter, and after said first and fifth switches are turned off, said seventh and eighth switches are turned on while said tri-state inverter operates as an inverter to output an output voltage of said first inverter on the output of said tri-state inverter.

2. The comparator according to claim 1, wherein the signal voltage and reference voltage are simultaneously output to said one end of said first capacitor and to said one end of said second capacitor respectively while said tri-state inverter is changed from the state operable as an inverter to a state where the output thereof has a high impedance, the high impedance state of the output is maintained even after said second and fifth switches are turned off, after said switch and fifth switches are turned off, said tri-state inverter is changed from the state where the output thereof has the high impedance to the state operable as an inverter to output an output voltage of said first inverter on the output of said tri-state inverter.

* * * * *